US008418021B2

(12) United States Patent
Lin et al.

(10) Patent No.: US 8,418,021 B2
(45) Date of Patent: Apr. 9, 2013

(54) STORAGE CONTROLLER WITH ENCODING/DECODING CIRCUIT PROGRAMMABLE TO SUPPORT DIFFERENT ECC REQUIREMENTS AND RELATED METHOD THEREOF

(75) Inventors: Li-Lien Lin, Hsinchu (TW); Chao-Yi Wu, Kaohsiung County (TW); Chien-Chung Wu, Kaohsiung (TW); Li-Chun Tu, Hsinchu (TW)

(73) Assignee: Mediatek Inc., Science-Based Industrial Park, Hsin-Chu (TW)

( * ) Notice: Subject to any disclaimer, the term of this patent is extended or adjusted under 35 U.S.C. 154(b) by 565 days.

(21) Appl. No.: 12/645,490

(22) Filed: Dec. 23, 2009

(65) Prior Publication Data

US 2010/0251068 A1 Sep. 30, 2010

Related U.S. Application Data

(60) Provisional application No. 61/163,951, filed on Mar. 27, 2009.

(51) Int. Cl.
*G06F 11/00* (2006.01)
(52) U.S. Cl. ...................................................... 714/755
(58) Field of Classification Search ........................ None
See application file for complete search history.

(56) References Cited

U.S. PATENT DOCUMENTS

| 4,562,577 | A | 12/1985 | Glover | |
|---|---|---|---|---|
| 6,252,838 | B1 | 6/2001 | Kuroda | |
| 7,304,990 | B2 * | 12/2007 | Rajwan | 370/389 |
| 7,543,215 | B2 | 6/2009 | Shieh | |
| 7,844,879 | B2 | 11/2010 | Ramamoorthy | |
| 8,065,583 | B2 | 11/2011 | Radke | |
| 2003/0135530 | A1 * | 7/2003 | Parthasarathy et al. | 708/492 |
| 2004/0015771 | A1 | 1/2004 | Lasser | |
| 2004/0223435 | A1 | 11/2004 | Nishi | |
| 2005/0099910 | A1 | 5/2005 | Sako | |
| 2007/0171714 | A1 | 7/2007 | Wu | |
| 2007/0171730 | A1 | 7/2007 | Ramamoorthy | |
| 2008/0028274 | A1 * | 1/2008 | Lin | 714/752 |
| 2008/0034272 | A1 | 2/2008 | Wu | |
| 2008/0082897 | A1 | 4/2008 | Brandman | |
| 2008/0137414 | A1 | 6/2008 | Park | |
| 2009/0063934 | A1 * | 3/2009 | Jo | 714/764 |
| 2009/0217134 | A1 | 8/2009 | Shieh | |
| 2010/0199149 | A1 | 8/2010 | Weingarten | |
| 2010/0251066 | A1 * | 9/2010 | Radke | 714/752 |
| 2011/0060969 | A1 | 3/2011 | Ramamoorthy | |
| 2012/0079178 | A1 * | 3/2012 | Litsyn et al. | 711/103 |

\* cited by examiner

*Primary Examiner* — Michael Maskulinski
(74) *Attorney, Agent, or Firm* — Winston Hsu; Scott Margo

(57) ABSTRACT

One exemplary storage controller of controlling data access of a storage device includes an encoding circuit and a control circuit. The encoding circuit is programmable to support a plurality of different finite fields, and implemented for generating encoded data according to an adjustable finite field setting. The control circuit is implemented for controlling the adjustable finite field setting of the encoding circuit and recording data into the storage device according to the encoded data. Another exemplary storage controller of controlling data access of a storage device includes a decoding circuit and a control circuit. The decoding circuit is programmable to support a plurality of different finite fields, and implemented for generating decoded data according to an adjustable finite field setting. The control circuit is implemented for reading data from the storage device to obtain readout data and controlling the adjustable finite field setting of the decoding circuit.

11 Claims, 14 Drawing Sheets

STORAGE CONTROLLER WITH ENCODING/DECODING CIRCUIT PROGRAMMABLE TO SUPPORT DIFFERENT ECC REQUIREMENTS AND RELATED METHOD THEREOF

CROSS REFERENCE TO RELATED APPLICATIONS

This application claims the benefit of U.S. Provisional Application No. 61/163,951, filed on Mar. 27, 2009 and included herein by reference.

BACKGROUND

The disclosed embodiments of the present invention relate to recording data into and/or reading data from a storage device, and more particularly, to a storage controller having an encoding circuit/decoding circuit programmable to support multiple finite fields, multiple codeword lengths and/or multiple error correction capabilities and related method thereof.

Error detection and correction techniques are employed to effectively correct errors caused by various factors to obtain error-free data. Taking a flash memory for example, continuous improvements in price/performance for the flash memory have enabled the flash memory to become the long term storage of choice for many applications. However, during the fabrication, the flash memory may contain defects (e.g., defective memory cells), and more defects may appear during the device lifetime, thereby limiting its usage. To manage these defects and to achieve efficient and reliable operation, the memory system typically uses error detection and correction techniques to ensure reliable data reproduction.

In a typical flash memory device, Bose-Chaudhuri-Hocquenghem (BCH) coding is commonly employed to detect and correct data errors. The codeword length and the error correction capability of the BCH coding are determined by the following formula: $n-k \leq m \cdot t$, where n represents a BCH codeword length (e.g., a total length of user data and parity), k represents a length of user data, m represents a finite field (also called a Galois field), and t represents an error correction capability.

With regard to the single-level-cell (SLC) flash memory devices, the ECC requirements of SLC flash devices fabricated by different manufacturers are similar. As the required ECC requirements are similar, the same control chip which provides a BCH code in the finite field $GF(2^3)$ can be employed to meet the ECC requirements of SLC flash devices fabricated by different manufacturers.

However, regarding the multi-level-cell (MLC) flash memory devices, MLC flash devices fabricated by different manufacturers have different page lengths and ECC requirements. In addition, different ECC codeword lengths will require different finite fields. For example, a user data length of 512 bytes generally requires the use of a finite field $GF(2^{13})$, a user data length of 1K bytes generally requires the use of a finite field $GF(2^{14})$; and a user data length of 2K bytes generally requires the use of a finite field $GF(2^{15})$. Therefore, a conventional control chip of an MLC flash memory device only supports a single finite field and a single error correction capability required by the MLC flash memory device. That is, the same control chip which supports a single finite field and a single error correction capability cannot be applied to different MLC flash devices with different page lengths and ECC requirements.

The conventional control chip supporting a single finite field and a single error correction capability lacks flexibility. For example, a control chip employing a single and fixed finite field fails to support a longer codeword length, and uses more parity bits when supporting a shorter codeword length, which wastes the spare area of the flash memory device. Moreover, a control chip employing a single and fixed error correction capability is unable to dynamically adjust the error correction capability in response to requirements of different applications.

Therefore, there is a need for a programmable storage controller which can satisfy different ECC requirements to achieve the optimum data protection.

SUMMARY

In accordance with exemplary embodiments of the present invention, a storage controller having an encoding circuit/decoding circuit programmable to support multiple finite fields, multiple codeword lengths and/or multiple error correction capabilities and related method thereof are disclosed.

According to a first aspect of the present invention, an exemplary storage controller of controlling data access of a storage device is disclosed. The exemplary storage controller includes an encoding circuit and a control circuit. The encoding circuit is programmable to support a plurality of different finite fields and configured for generating encoded data according to an adjustable finite field setting. The control circuit is coupled to the encoding circuit, and implemented for controlling the adjustable finite field setting of the encoding circuit and recording data into the storage device according to the encoded data.

According to a second aspect of the present invention, an exemplary storage controller of controlling data access of a storage device is disclosed. The exemplary storage controller includes an encoding circuit and a control circuit. The encoding circuit is programmable to support a plurality of different error correction capabilities, and implemented for generating encoded data according to an adjustable error correction capability setting. The control circuit is coupled to the encoding circuit, and implemented for adjusting the adjustable error correction capability setting supported by the encoding circuit and recording data into the storage device according to the encoded data.

According to a third aspect of the present invention, an exemplary storage controller of controlling data access of a storage device is disclosed. The exemplary storage controller includes an encoding circuit and a control circuit. The encoding circuit is programmable to support a plurality of different codeword lengths, and implemented for generating encoded data according to an adjustable codeword length setting. The control circuit is coupled to the encoding circuit, and implemented for adjusting the adjustable codeword length setting supported by the encoding circuit and recording data into the storage device according to the encoded data.

According to a fourth aspect of the present invention, an exemplary storage controller of controlling data access of a storage device is disclosed. The exemplary storage controller includes a decoding circuit and a control circuit. The decoding circuit is programmable to support a plurality of different finite fields and configured for generating decoded data according to an adjustable finite field setting. The control circuit is coupled to the decoding circuit, and implemented for reading data from the storage device to obtain readout data and controlling the adjustable finite field setting of the decoding circuit.

According to a fifth aspect of the present invention, an exemplary storage controller of controlling data access of a storage device is disclosed. The exemplary storage controller includes a decoding circuit and a control circuit. The decoding circuit is programmable to support a plurality of different error correction capabilities, and implemented for generating decoded data according to an adjustable error correction capability setting. The control circuit is coupled to the decoding circuit, and implemented for reading data from the storage device to obtain readout data and adjusting the adjustable error correction capability setting supported by the decoding circuit.

According to a sixth aspect of the present invention, an exemplary storage controller of controlling data access of a storage device is disclosed. The exemplary storage controller includes a decoding circuit and a control circuit. The decoding circuit is programmable to support a plurality of different codeword lengths, and implemented for generating decoded data according to an adjustable codeword length setting. The control circuit is coupled to the decoding circuit, and implemented for reading data from the storage device to obtain readout data and adjusting the adjustable codeword length setting supported by the decoding circuit.

According to a seventh aspect of the present invention, an exemplary method of controlling data access of a storage device is disclosed. The exemplary method includes: controlling an adjustable finite field setting, wherein the adjustable finite field setting is programmable to support a plurality of different finite fields; generating encoded data according to at least the adjustable finite field setting; and recording data into the storage device according to the encoded data.

According to an eighth aspect of the present invention, an exemplary method of controlling data access of a storage device is disclosed. The exemplary method includes: reading data from the storage device to obtain readout data; controlling an adjustable finite field setting, wherein the adjustable finite field setting is programmable to support a plurality of different finite fields; and generating decoded data by decoding the readout data according to at least the adjustable finite field setting.

These and other objectives of the present invention will no doubt become obvious to those of ordinary skill in the art after reading the following detailed description of the preferred embodiment that is illustrated in the various figures and drawings.

DETAILED DESCRIPTION

Certain terms are used throughout the description and following claims to refer to particular components. As one skilled in the art will appreciate, manufacturers may refer to a component by different names. This document does not intend to distinguish between components that differ in name but not function. In the following description and in the claims, the terms "include" and "comprise" are used in an open-ended fashion, and thus should be interpreted to mean "include, but not limited to . . . ". Also, the term "couple" is intended to mean either an indirect or direct electrical connection. Accordingly, if one device is coupled to another device, that connection may be through a direct electrical connection, or through an indirect electrical connection via other devices and connections.

The conception of the present invention is to provide a programmable storage controller which can support different finite fields, such as finite fields $GF(2^{13})$, $GF(2^{14})$, and $GF(2^{15})$. Preferably, the programmable storage controller further supports different error correction capabilities (e.g., the programmable error correction capability falls within a range 0-48) and/or different codeword lengths (e.g., codewords including user data of 512 bytes, 1K bytes, and 2K bytes). In this way, the programmable storage controller can be programmed to meet different ECC requirements of storage devices (e.g., flash memory devices or other data storage applications) fabricated by different manufacturers. It should be note that applying the exemplary storage controllers disclosed hereinafter to flash memory devices are for illustrative purposes only, and not meant to be limitations to the scope of the present invention. For clarity, certain exemplary embodiments are provided as follows.

Figure 1:
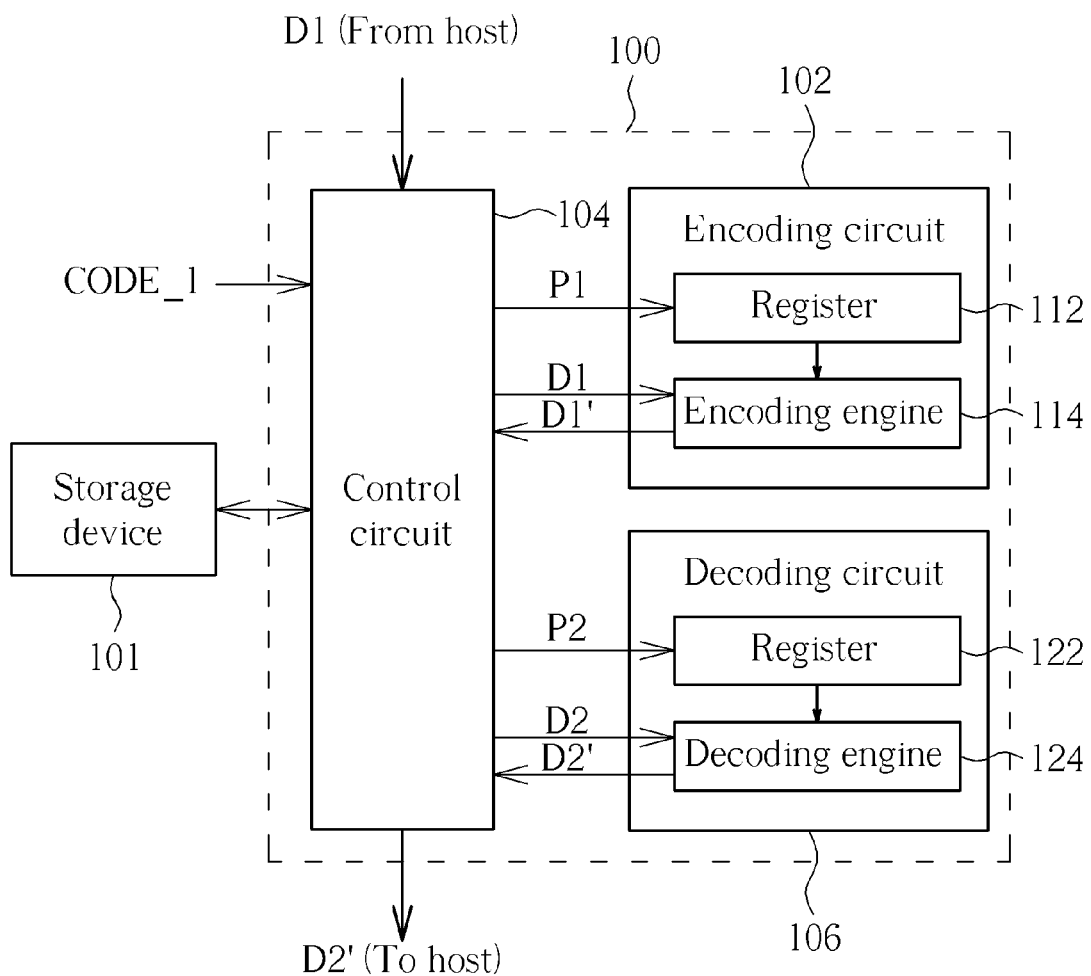
FIG. 1 is a block diagram illustrating a first exemplary embodiment of a storage controller according to the present invention.

FIG. 1 is a block diagram illustrating a first exemplary embodiment of a storage controller according to the present invention. The exemplary storage controller 100 includes, but is not limited to, an encoding circuit 102, a control circuit 104, and a decoding circuit 106. It should be noted that only the elements pertinent to the present invention are shown in FIG. 1 for simplicity and clarity. The storage controller 100 is used for controlling data access of a storage device (e.g., a non-volatile memory) 101, and communicates with a host (not shown). By way of example, but not limitation, the storage device 101 implemented using a non-volatile memory may be a flash memory device, such as an MLC flash application. The encoding circuit 102 is programmable and can support at least a plurality of different finite fields, such as GF(2^13), GF(2^14), and GF(2^15). Therefore, when the control circuit 104 receives input data D1 from the host, the encoding circuit 102 encodes the input data D1 transmitted from the control circuit 104 to generate encoded data D1' according to at least an adjustable finite field setting thereof, and the control circuit 104 records data into the storage device 101 according to the encoded data D1' generated from the encoding circuit 102.

In one exemplary implementation, the control circuit 104 may be implemented by using a microprocessor (not shown) and an encoder/decoder controller (not shown), where the microprocessor reads the instruction code from a storage (e.g., a read-only memory) to control the encoding circuit 102 and the decoding circuit 106 to select a specific finite filed, and the encoder/decoder controller controls the data transaction between the storage device 101 and the encoding circuit 102 and the data transaction between the storage device 101 and the decoding circuit 106. However, this is for illustrative purposes only, and is not meant to be taken as a limitation to the scope of the present invention. That is, the control circuit 104 may include additional circuit blocks to support other functions.

In this exemplary embodiment, the encoding circuit 102 includes a register 112 and an encoding engine 114, where the register 112 is for storing encoding coefficients P1, and the encoding engine 114 is coupled to the register 112 for generating the encoded data D1' by encoding the input data D1 according to the encoding coefficients P1 stored in the register 112. It should be noted that when the control circuit 104 receives an instruction code CODE_1 for programming the configuration of the encoding circuit 102, the control circuit 104 writes the encoding coefficients P1 into the register 112 in response to the instruction code CODE_1. In this way, the adjustable finite field setting of the encoding circuit 102 can be properly configured by the encoding coefficients P1. Thus, the encoding circuit 102 is programmable to support different ECC requirements.

In the embodiment shown in FIG. 1, the decoding circuit 106 is also programmable and can support at least a plurality of different finite fields, such as GF(2^13), GF(2^14), and GF(2^15). Therefore, when the control circuit 104 reads data from the storage device 101 to obtain readout data D2, the decoding circuit 106 decodes the readout data D2 transmitted from the control circuit 104 to generate decoded data D2' according to at least an adjustable finite field setting thereof. Then, the control circuit 104 outputs the decoded data D2 to the host (not shown). In this exemplary embodiment, the decoding circuit 106 includes a register 122 and a decoding engine 124, where the register 122 is for storing decoding parameters P2, and the decoding engine 124 is coupled to the register 122 for generating the decoded data D2' by decoding the readout data D2 according to the decoding parameters P2 stored in the register 122. It should be noted that when the control circuit 104 receives the instruction code CODE_1 for programming the configuration of the decoding circuit 106, the control circuit 104 writes the decoding parameters P2 into the register 122 in response to the instruction code CODE_1. In this way, the adjustable finite field setting of the decoding circuit 106 can be properly configured by the decoding parameters P2. Thus, the decoding circuit 106 is programmable to support different ECC requirements.

Briefly summarized, in the exemplary embodiment shown in FIG. 1, the encoding circuit 102 and the decoding circuit 106 can support different finite fields via adjusting the encoding coefficients P1 and decoding parameters P2 stored in the registers 112 and 122, respectively.

Figure 2:
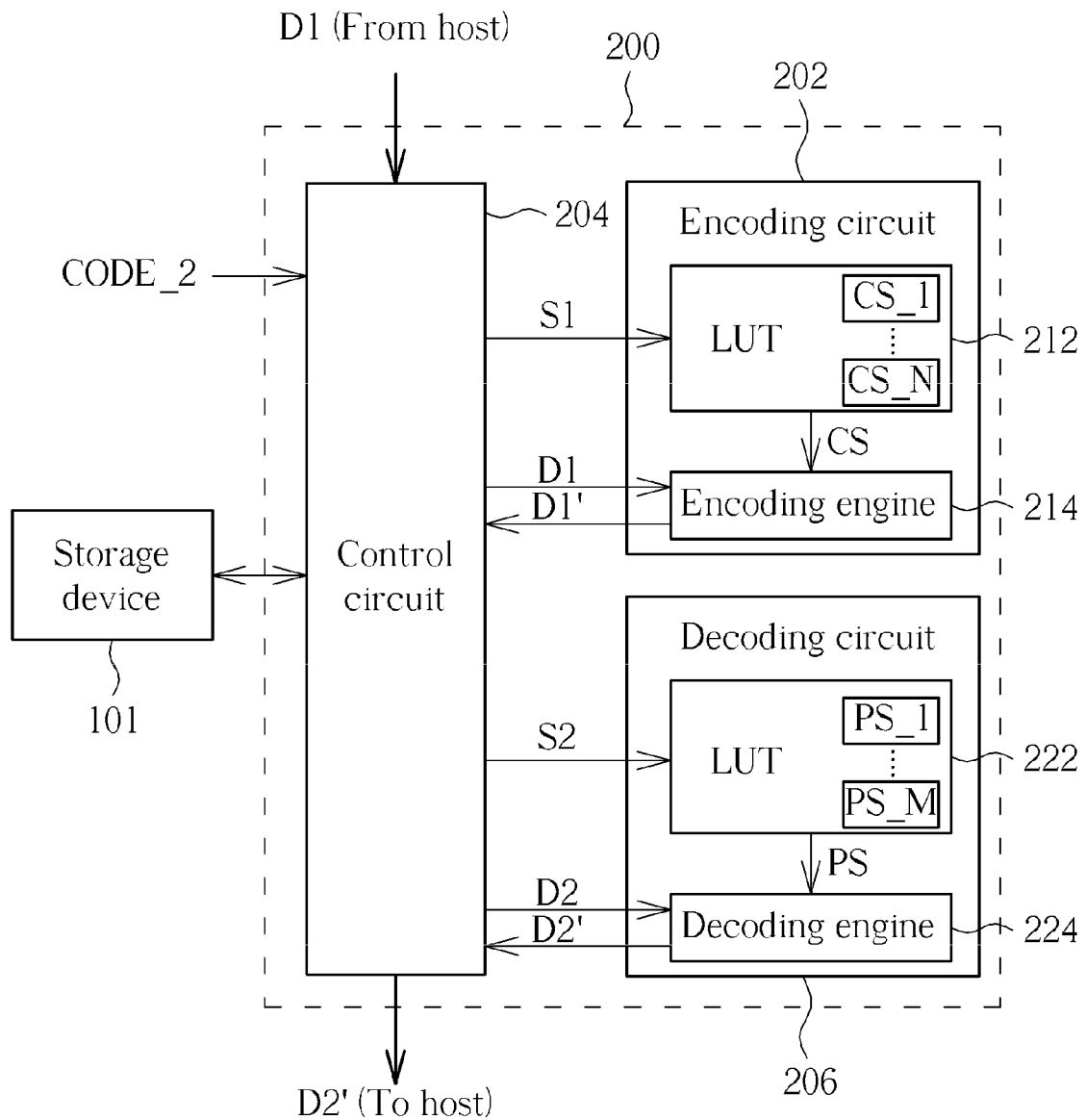
FIG. 2 is a block diagram illustrating a second exemplary embodiment of a storage controller according to the present invention.

Please refer to FIG. 2, which is a block diagram illustrating a second exemplary embodiment of a storage controller according to the present invention. The exemplary storage controller 200 includes, but is not limited to, an encoding circuit 202, a control circuit 204, and a decoding circuit 206. It should be noted that only the elements pertinent to the present invention are shown in FIG. 2 for simplicity and clarity. The storage controller 200 is used for controlling data access of the storage device 101, and communicates with a host (not shown). Similarly, each of the encoding circuit 202 and decoding circuit 206 is programmable and can support at least a plurality of different finite fields, such as GF(2^13), GF(2^14), and GF(2^15).

Regarding the encoding circuit 202, it includes a look-up table (LUT) 212 and an encoding engine 214, where the LUT 212 stores a plurality of encoding coefficient sets CS_1-CS_N each having encoding coefficients, and outputs a specific encoding coefficient set CS selected from the pre-stored encoding coefficient sets CS_1-CS_N in response to a selection signal S1, and the encoding engine 214 is coupled to the LUT 212 for generating the encoded data D1' by encoding the input data D1 according to the specific encoding coefficient set CS provided by the LUT 212. It should be noted that when the control circuit 204 receives an instruction code CODE_2 for programming the configuration of the encoding circuit 202, the control circuit 204 generates the above-mentioned selection signal S1 to the LUT 212 in response to the instruction code CODE_2. In this way, the adjustable finite field setting of the encoding circuit 202 can be properly configured by the specific encoding coefficient set CS selected due to the selection signal S1.

Regarding the decoding circuit 206, it includes a look-up table (LUT) 222 and a decoding engine 224, where the LUT 222 stores a plurality of decoding parameter sets PS_1-PS_M each having decoding parameters and outputs a specific decoding parameter set PS selected from the decoding parameter sets PS_1-PS_M in response to a selection signal S2, and the decoding engine 224 is coupled to the LUT 222 for generating the decoded data D2' by decoding the readout data D2 according to the decoding parameter set PS provided by the LUT 222. It should be noted that when the control circuit 204 receives the instruction code CODE_2 for programming the configuration of the decoding circuit 206, the control circuit 204 generates the above-mentioned selection signal S2 to the LUT 222 in response to the instruction code CODE_2. In this way, the adjustable finite field setting of the decoding circuit 206 can be properly configured by the specific decoding parameter set PS selected due to the selection signals S2.

Briefly summarized, in the exemplary embodiment shown in FIG. 2, the encoding circuit 202 and the decoding circuit 206 can support different finite fields via selecting a desired encoding coefficient set from pre-stored encoding coefficient sets and selecting a desired decoding parameter set from pre-stored decoding parameter sets.

In above exemplary embodiments shown in FIG. 1 and FIG. 2, the encoding circuit 102/202 and the decoding circuit 106/206 are programmed to support a desired finite filed by simply setting the encoding coefficients used by the encoding circuit 102/202 and the decoding parameters used by the decoding circuit 106/206. In other words, as the same encoding engine 114/214 and decoding engine 124/224 are used, the hardware cost can be reduced by such a hardware sharing technique employed by the storage controller 100/200. However, using individual hardware encoders and decoders to support different finite fields without hardware sharing implemented therein is also feasible.

Figure 3:
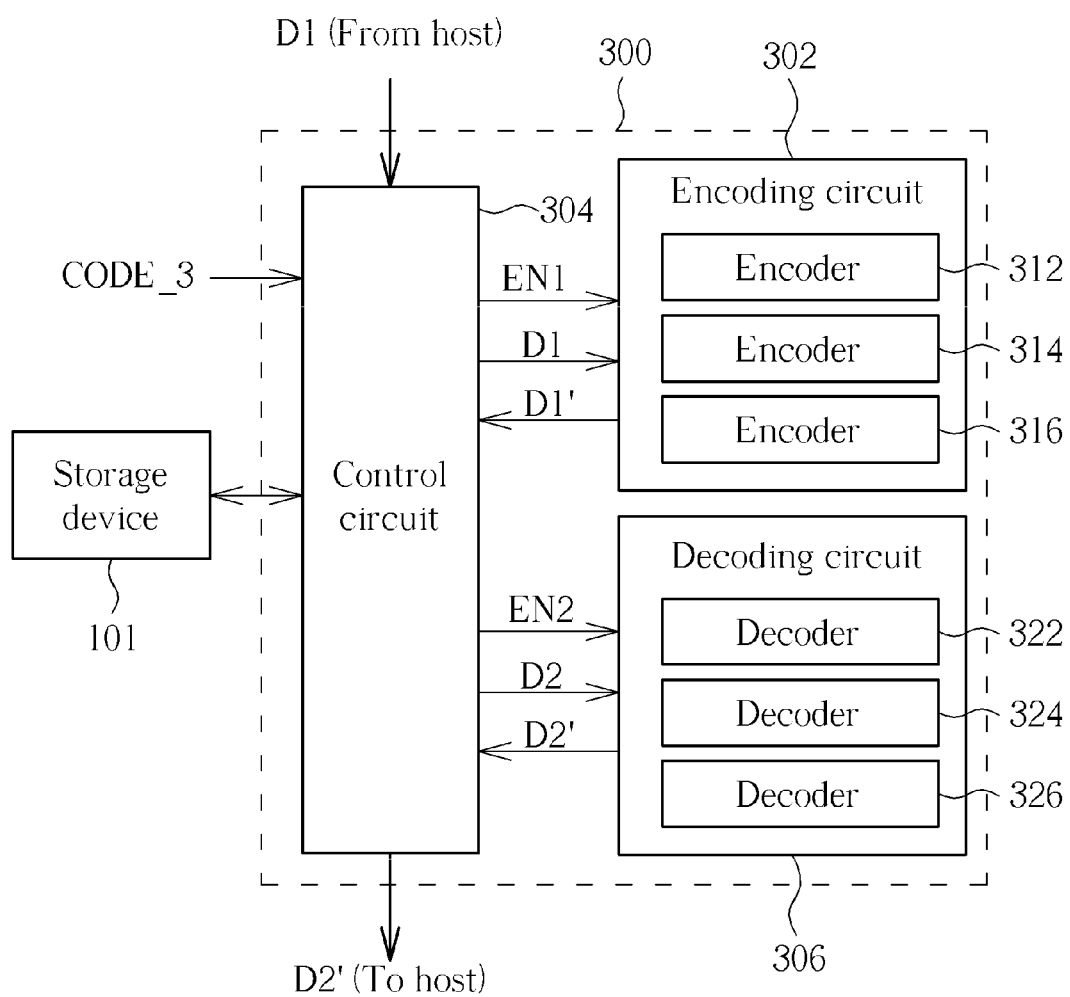
FIG. 3 is a block diagram illustrating a third exemplary embodiment of a storage controller according to the present invention.

Please refer to FIG. 3, which is a block diagram illustrating a third exemplary embodiment of a storage controller according to the present invention. The exemplary storage controller 300 includes, but is not limited to, an encoding circuit 302, a control circuit 304, and a decoding circuit 306. It should be noted that only the elements pertinent to the present invention are shown in FIG. 3 for simplicity and clarity. The storage controller 300 is used for controlling data access of a storage device 101, and communicates with a host (not shown). Similarly, each of the encoding circuit 302 and decoding circuit 306 is programmable and can support at least a plurality of different finite fields, such as $GF(2^{13})$, $GF(2^{14})$, and $GF(2^{15})$.

Regarding the encoding circuit 302, it includes a plurality of encoders (e.g., encoders 312, 314, 316 shown in FIG. 3) corresponding to different finite fields such as $GF(2^{13})$, $GF(2^{14})$ and $GF(2^{15})$, respectively. Please note that the hardware encoders included in the encoding circuit 302 are distinct from each other, and the number of hardware encoders implemented in the encoding circuit 302 is adjustable based on design requirements. When the control circuit 304 receives an instruction code CODE_3 for programming the configuration of the encoding circuit 302, the control circuit 304 generates an enable signal EN1 to the encoding circuit 302 in response to the instruction code CODE_3 for enabling one of the encoders 312, 314, 316 to thereby set the adjustable finite field of the encoding circuit 302. In other words, the enabled encoder is responsible for generating the encoded data D1' by encoding the input data D1 according to its designated finite filed setting. In this way, the adjustable finite field setting of the encoding circuit 302 can be properly configured by a selected encoder which is enabled due to the enable signal EN1.

Regarding the decoding circuit 306, it includes a plurality of decoders (e.g., decoders 322, 324, 326 shown in FIG. 3) corresponding to different finite fields such as $GF(2^{13})$, $GF(2^{14})$ and $GF(2^{15})$, respectively. Please note that the hardware encoders included in the decoding circuit 306 are distinct from each other, and the number of hardware decoders implemented in the decoding circuit 306 is adjustable based on design requirements. When the control circuit 304 receives the instruction code CODE_3 for programming the configuration of the decoding circuit 306, the control circuit 304 generates an enable signal EN2 to the decoding circuit 306 in response to the instruction code CODE_3 for enabling one of the decoders 322, 324, 326 to thereby set the adjustable finite field of the decoding circuit 306. In other words, the enabled decoder is responsible for generating the decoded data D2' by decoding the readout data D2 according to its designated finite filed setting. In this way, the adjustable finite field setting of the decoding circuit 306 can be properly set by a selected decoder which is enabled due to the enable signal EN2.

Briefly summarized, in the exemplary embodiment shown in FIG. 3, the encoding circuit 302 and the decoding circuit 306 can support different finite fields via enabling a desired encoder selected from pre-built hardware encoders and a desired decoder selected from pre-built hardware decoders.

It should be noted that the embodiments shown in FIG. 1-FIG. 3 are for illustrative purposes only, and are not meant to be taken as limitations of the present invention. For example, in one alternative design, the decoding circuit 106 shown in FIG. 1 can be replaced with the decoding circuit 206 shown in FIG. 2 or the decoding circuit 306 shown in FIG. 3; in another alternative design, the decoding circuit 206 shown in FIG. 2 can be replaced with the decoding circuit 106 shown in FIG. 1 or the decoding circuit 306 shown in FIG. 3; and in yet another alternative design, the decoding circuit 306 shown in FIG. 3 can be replaced with the decoding circuit 106 shown in FIG. 1 or the decoding circuit 206 shown in FIG. 2. These all fall within the scope of the present invention.

For clarity, exemplary circuit implementations of the programmable encoding circuit and the programmable decoding circuit are briefly described as below. Please refer to FIG. 4, which is a diagram of an exemplary implementation of an encoding circuit according to the present invention. The exemplary encoding circuit 400 includes a coefficient register 402, a plurality of shift and bitwise XOR logic circuits 404, a shift controller 406 having a plurality of registers 407, and a multiplexer (MUX) 408. Each of the registers 407 is to store a partial encoding parity result of a corresponding channel of a storage device (e.g., a flash memory device). That is, the number of registers 407 depends on the number of channels of the storage device. When data of a specific channel is inputted via the data bus (e.g., an 8-bit data bus in this exemplary implementation), the MUX 408 outputs a stored partial encoding parity result of the specific channel under the control of a channel selection control signal Ch_sel generated from a control circuit mentioned above.

Figure 4:
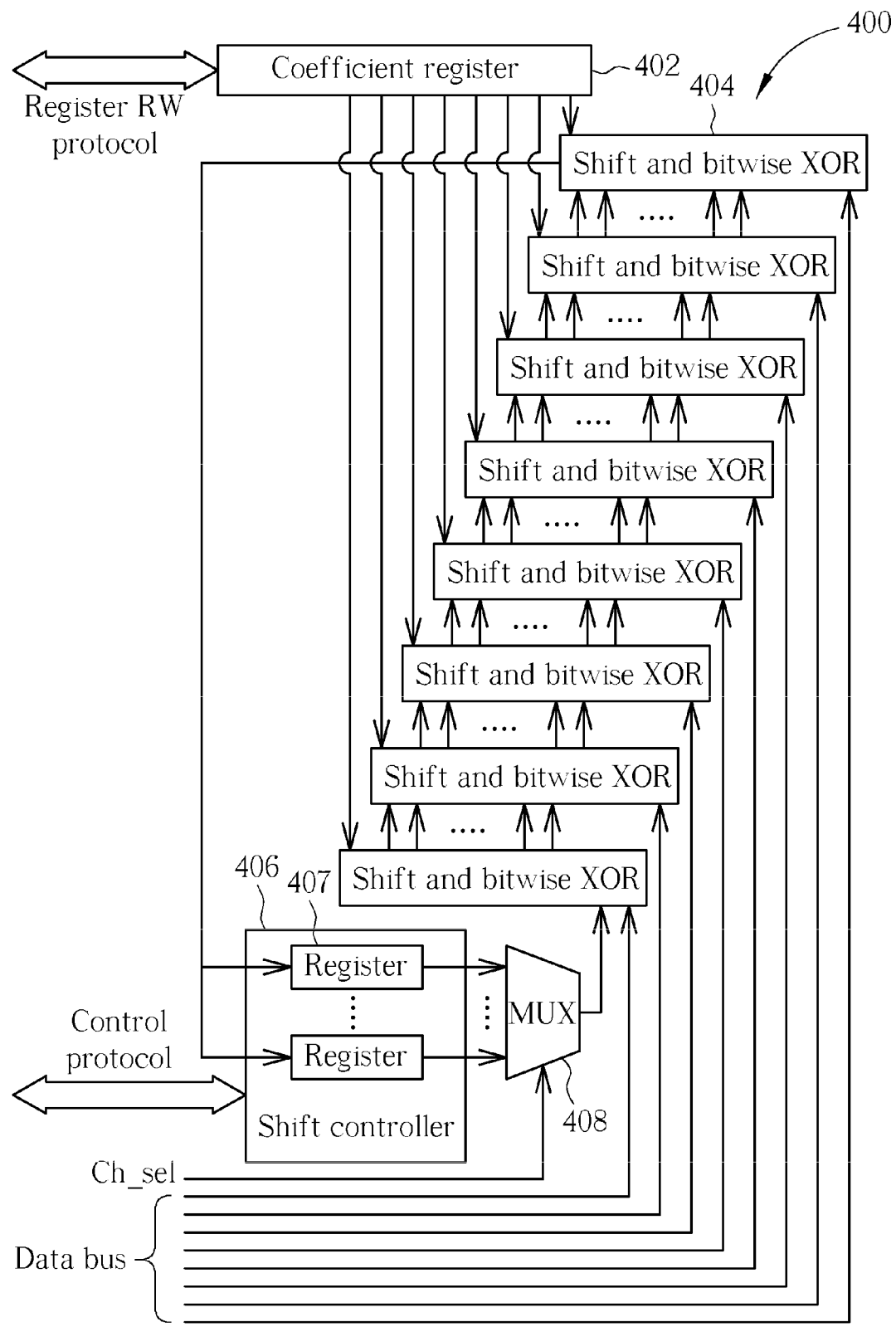
FIG. 4 is a diagram of an exemplary implementation of an encoding circuit according to the present invention.

The shift and bitwise XOR logic circuits 404 are operative to generate a next partial encoding parity result according to data of the specific channel transmitted via the data bus and the partial encoding parity result provided by the MUX 408, and then the shift controller 406, which is controlled via the control protocol between the encoding circuit 400 and a control circuit (e.g., the control circuit 104 shown in FIG. 1), stores the next partial encoding parity result of the specific channel. As a person can readily understand details of generating the partial encoding parity result, further description is omitted here for brevity. It should be noted that the coefficients of the generator polynomial are programmable and stored into the coefficient register 402 via the register RW protocol between the encoding circuit 400 and a control circuit (e.g., the control circuit 104 shown in FIG. 1). As shown in FIG. 4, the generator polynomial coefficients are used by the shift and bitwise XOR logic circuits 404 to derive the desired partial encoding parity result for each channel. It should be noted that the generator polynomial is used for generating ECC codes in an encoding process; in addition, the generator polynomial is also used for verifying correctness of codewords in a decoding process. Therefore, the exemplary circuit shown in FIG. 4 can also be employed in a decoding circuit programmable to support different finite fields.

Figure 5:
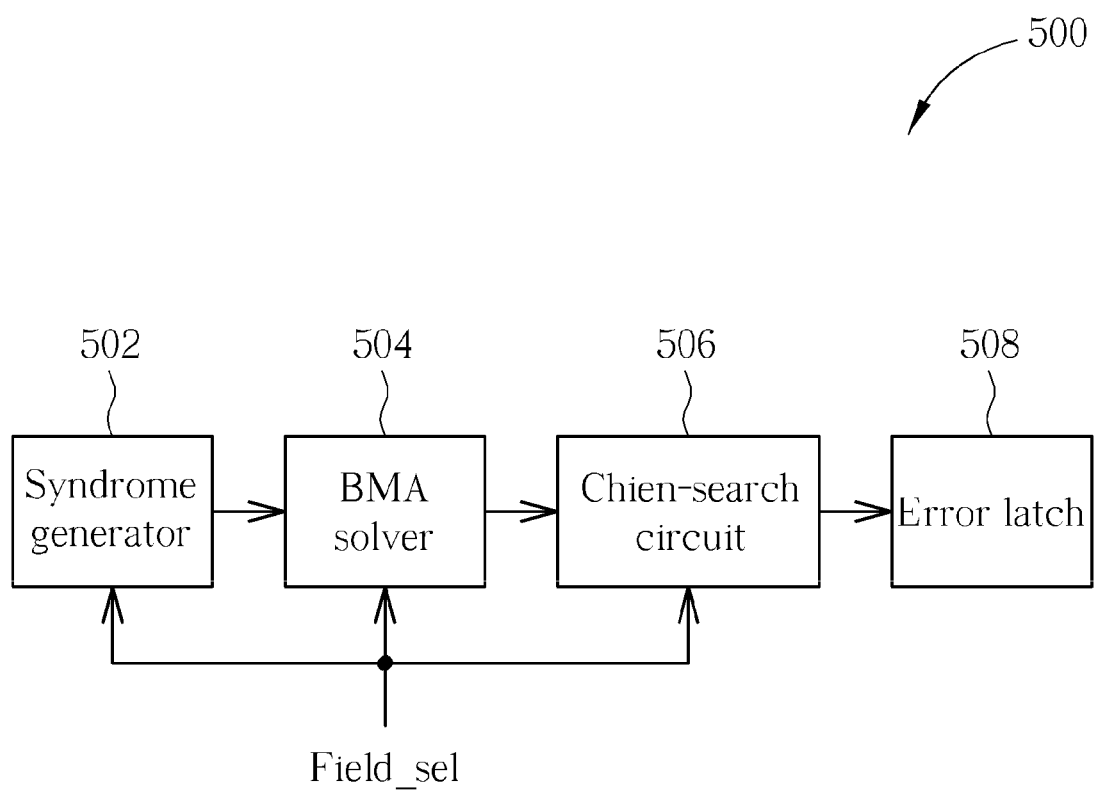
FIG. 5 is a diagram of an exemplary implementation of a decoding circuit according to the present invention.

FIG. 5 is a diagram of an exemplary implementation of a decoding circuit according to the present invention. The exemplary decoding circuit 500 includes a syndrome generator 502, a Berlekamp-Massey algorithm (BMA) solver 504, a Chien-search circuit 506, and an error latch 508, where the syndrome generator 502 is used to calculate syndrome values. The BMA solver 504 is to solve the key equation and find the error locator according to the syndrome values, the Chien-search circuit 506 is to find the actual error location according to the error locator, and the error latch 508 is to store information of the actual error location referred to for correcting error bits in a storage device (e.g., a flash memory device). As a person skilled in the art can readily understand the flow of the decoding procedure, further details is omitted here for brevity. The difference between the exemplary decoding circuit 500 of the present invention and the conventional decoder (e.g., a BCH decoder) is that the syndrome generator 502, the BMA solver 504 and the Chien-search circuit 506 are programmable to support different finite fields. For example, the control signal Field_sel generated from a control circuit (e.g., the control circuit 104, 204, or 304) will instruct the syndrome generator 502, the BMA solver 504 and the Chien-search circuit 506 to support a selected finite field through one of the finite field configuring schemes shown in FIG. 1-FIG. 3. By way of example, but not limitation, the control signal Field_sel may be a signal carrying the decoding parameters P2, the selection signal S2, or the enable signal EN2.

Figure 6:
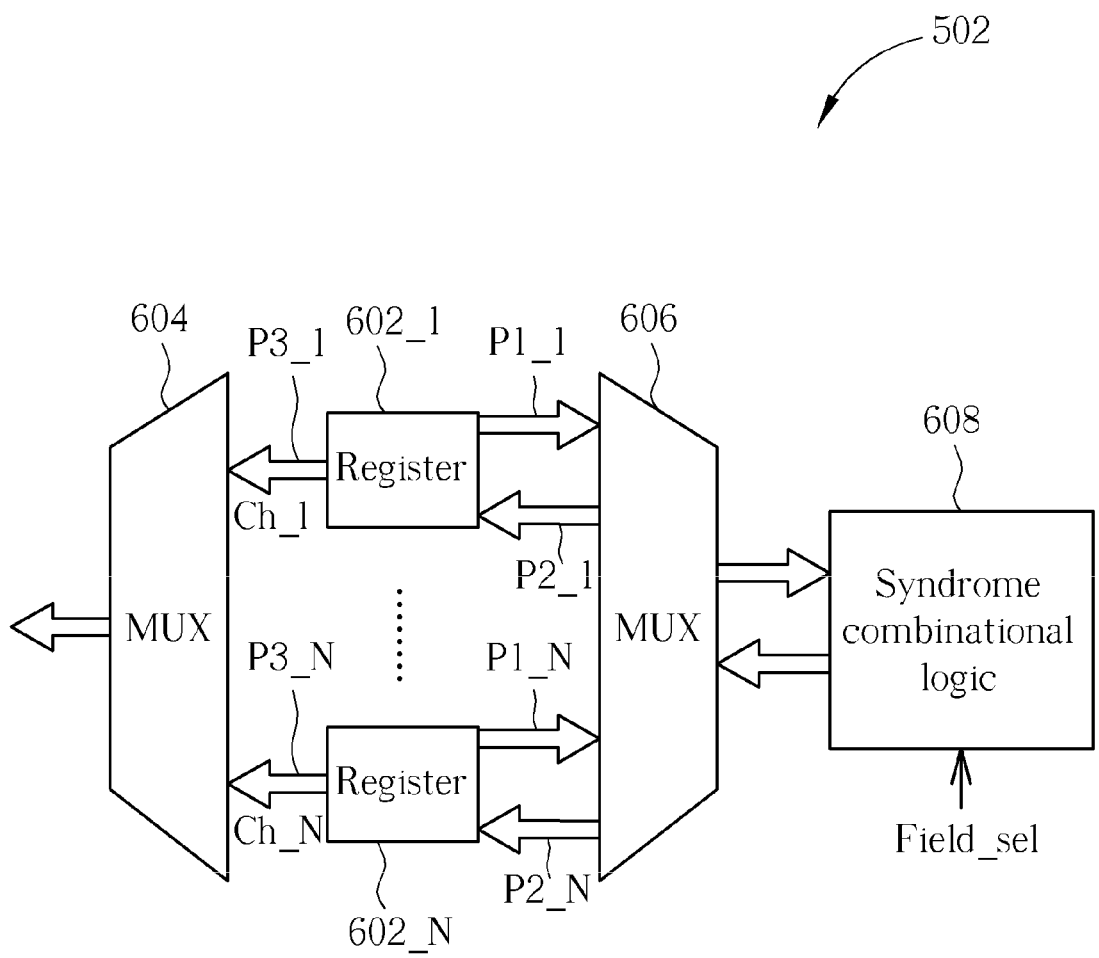
FIG. 6 is a diagram of an exemplary implementation of a syndrome generator shown in FIG. 5.

FIG. 6 is a diagram of an exemplary implementation of the syndrome generator 502 shown in FIG. 5. In a case where the decoding circuit 500 shown in FIG. 5 supports a plurality of channels Ch_1-Ch_N, the syndrome generator 502 therefore has a plurality of registers 602_1-602_N corresponding to channels Ch_1-Ch_N, respectively. With a proper control of the multiplexers 604 and 606, the selected partial syndrome data P1_1, . . . , P1_N is processed by a syndrome combinational logic 608, a corresponding calculation result P2_1, . . . , P2_N is fed back to the register 602_1, . . . , 602_N, and a final result P3_1, . . . , P3_N is fed back to a control circuit (such as the control circuit 304) mentioned above. The syndrome combinational logic 608 is capable of supporting a plurality of finite fields, such as $GF(2^{13})$, $GF(2^{14})$, and $GF(2^{15})$, and is configured by the control signal Field_sel generated from the control circuit to perform the syndrome generation under a selected finite field. Furthermore, the control signal Field_sel is obtained by programmable manner, and thus the syndrome combinational logic 608 supports several finite fields accordingly. In other words, the syndrome combinational logic 608 is programmable to support different finite fields under the control of the control signal Field_sel. It should be noted that the exemplary circuit shown in FIG. 6 can also be used in an encoding process.

Figure 7:
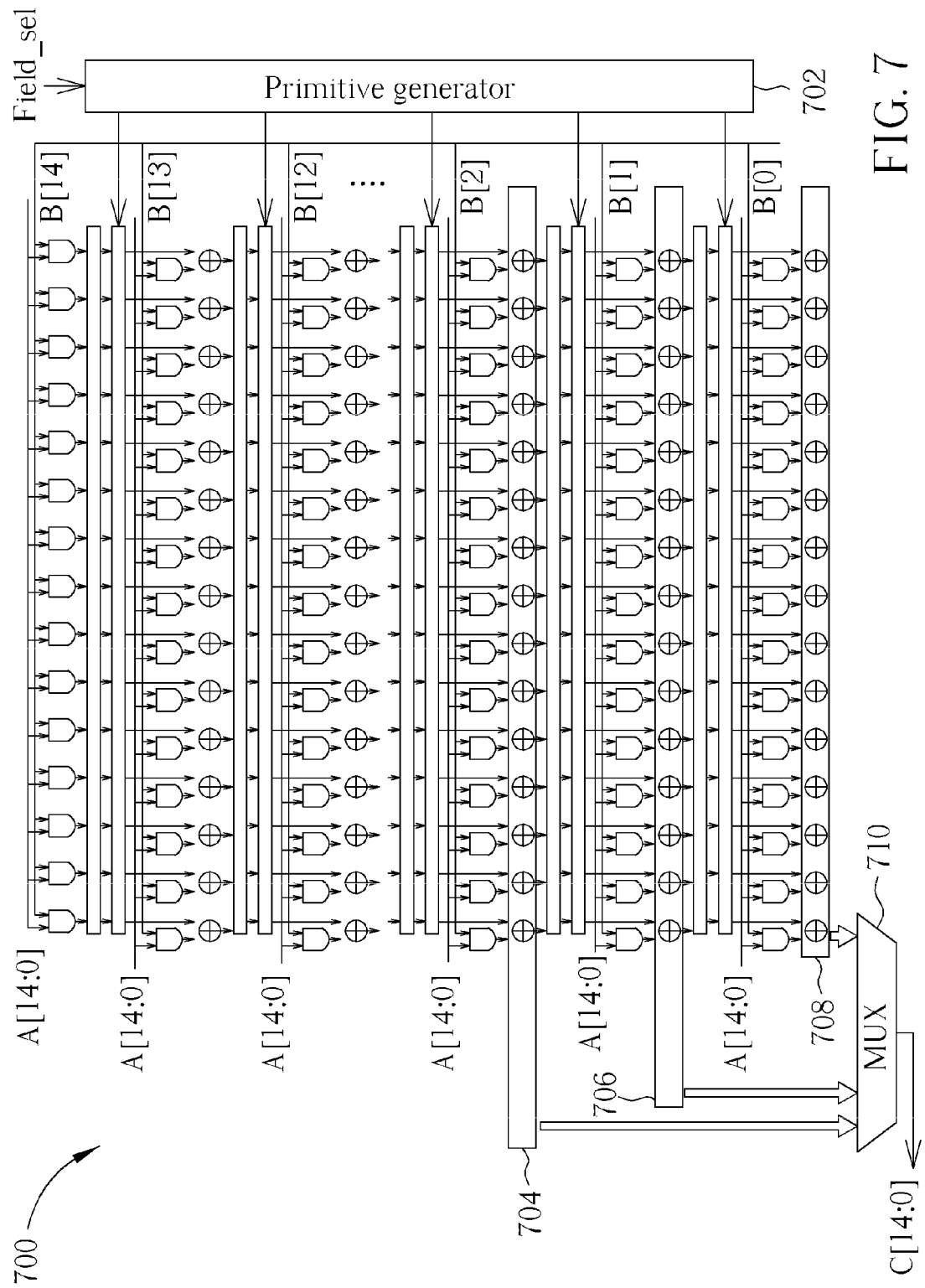
FIG. 7 is a diagram of an exemplary implementation of a universal variable multiplier employed in a BMA solver shown in FIG. 5.

FIG. 7 is a diagram of an exemplary implementation of a universal variable multiplier 700 employed in the BMA solver 504 shown in FIG. 5. The universal variable multiplier 700 is capable of supporting a plurality of different finite fields, such as $GF(2^{13})$, $GF(2^{14})$, and $GF(2^{15})$. The primitive generator 702 receives a control signal Field_sel from a control circuit (such as the control circuit 304) mentioned above, and then sets the required coefficients for the selected finite field. Besides, in accordance with the selected finite field, one of the outputs of the adder modules 704, 706, and 708 is outputted by the multiplexer 710. For example, when the selected finite field is $GF(2^{13})$, the multiplexer 710 selects the output of the adder module 704 as its output; when the selected finite field is $GF(2^{14})$, the multiplexer 710 selects the output of the adder module 706 as its output; and when the selected finite field is $GF(2^{15})$, the multiplexer 710 selects the output of the adder module 708 as its output.

Figure 8:
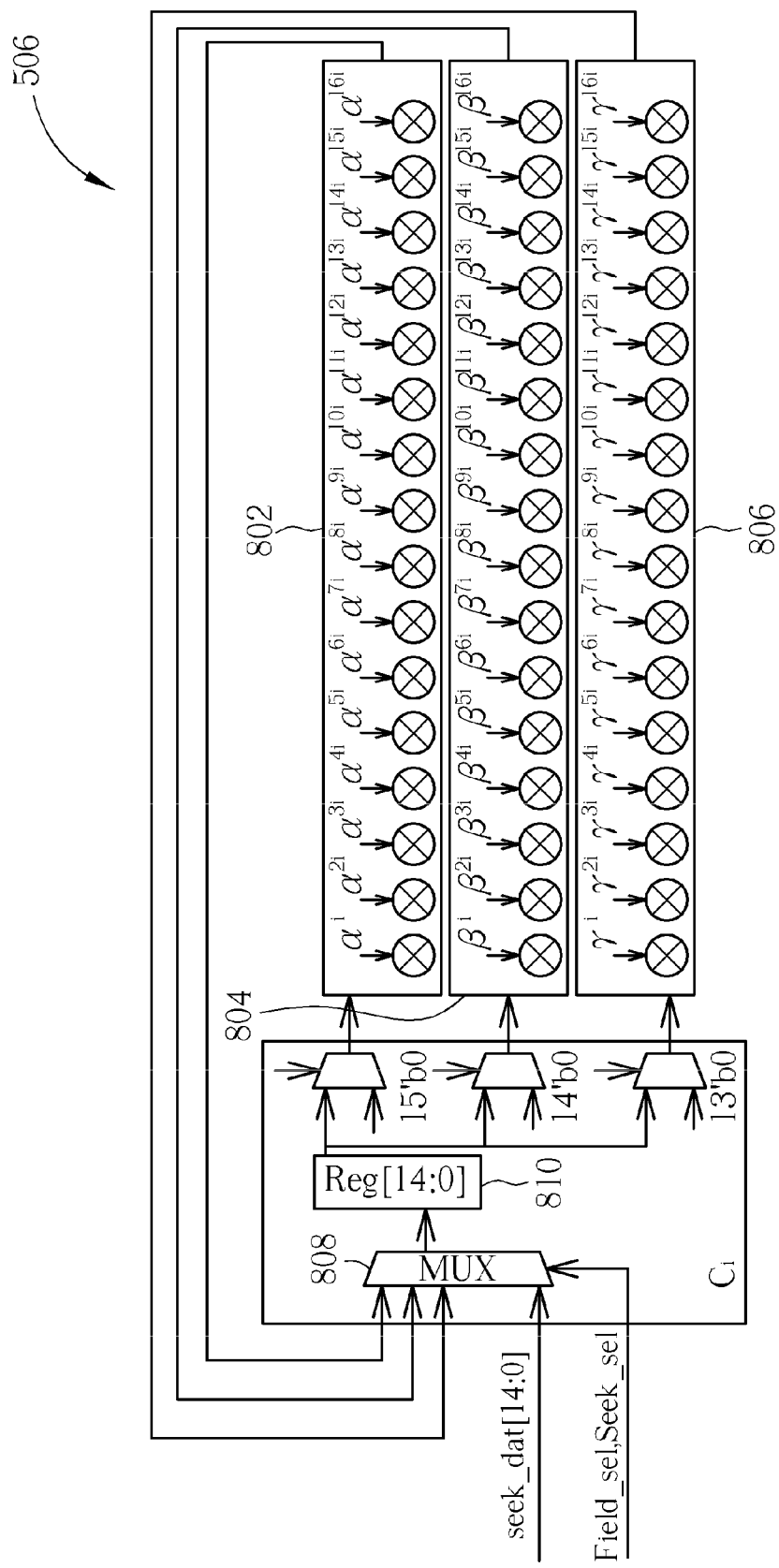
FIG. 8 is a diagram of an exemplary implementation of a Chien-search circuit shown in FIG. 5.

FIG. 8 is a diagram of an exemplary implementation of the Chien-search circuit 506 shown in FIG. 5. The exemplary Chien-search circuit 506 includes a plurality of Galois field multipliers 802, 804, 806 corresponding to different finite fields (e.g., $GF(2^{13})$, $GF(2^{14})$, and $GF(2^{15})$), respectively. The control signal Field_sel generated from a control circuit mentioned above determines which one of the Galois field multipliers 802, 804, 806 is employed to operate under a selected finite field. More specifically, the control signal Field_sel controls which one of the Galois field multiplier outputs is outputted by a multiplexer 808 to the register 810. In addition, another control signal Seek_sel is used to control the multiplexer 808 to transmit a BMA solver output seek_dat [14:0] or a selected Galois field multiplier output to the register 810. Besides, in this exemplary implementation, the Chien-search circuit 506 has a plurality of power down modes for different finite fields, respectively.

Preferably, the programmable encoding circuits (e.g., BCH decoders) 102, 202, 302 and decoding circuits (e.g., BCH decoders) 106, 206, 306 can also support different error correction capabilities and/or different codeword lengths. More specifically, a generalized design of the encoding circuit/decoding circuit may support multiple finite fields, multiple error correction capabilities, multiple codeword lengths, or a combination thereof. Certain exemplary encoding circuit/decoding circuit designs are provided as follows for illustrative purpose.

In a case where the encoding circuit 102/202/302 and the decoding circuit 106/206/306 are also programmable to support different error correction capabilities, the control circuit 104/204/304 further controls an adjustable error correction capability setting of the encoding circuit 102/202/302 and an adjustable error correction capability setting of the decoding circuit 106/206/306. Therefore, the encoding circuit 102/202/302 generates the encoded data D1' by encoding the input data D1 according to the corresponding adjustable finite field setting and adjustable error correction capability setting, and the decoding circuit 106/206/306 generates the decoded data D2' by decoding the readout data D2 according to the corresponding adjustable finite field setting and adjustable error correction capability setting. For example, the control circuit 104/204/304 adjusts the adjustable error correction capability setting according to significance or attribute of the input data D1/readout data D2.

Figure 9:
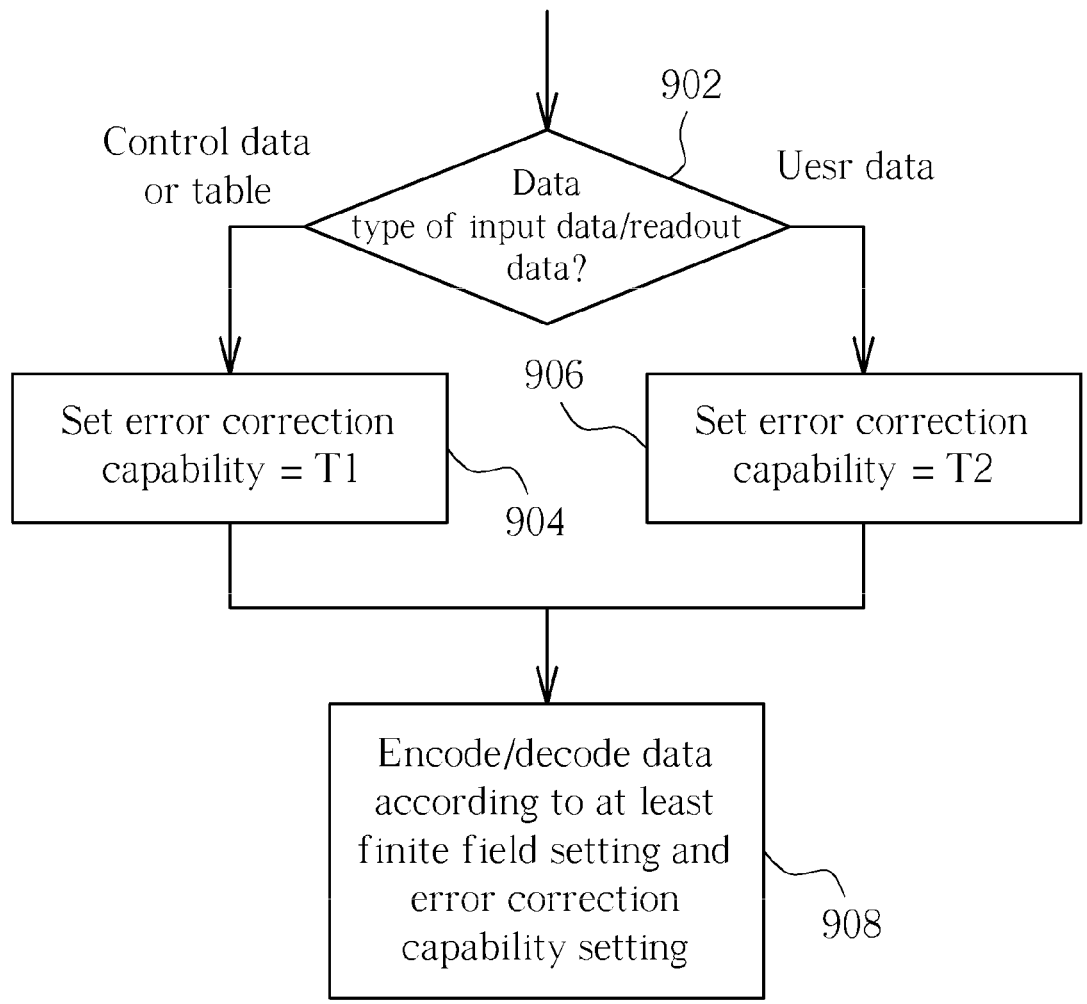
FIG. 9 is a flowchart illustrating an operation of the encoding circuit/decoding circuit whose error correction capability setting is configured by significance or attribute of input data.

FIG. 9 is a flowchart illustrating an operation of the encoding circuit/decoding circuit whose error correction capability setting is configured by significance or attribute of input data. In step 902, the control circuit 104/204/304 checks the data type of the input data D1. If the data type shows that the input data D1 is control data or table, the control circuit 104/204/304 sets the adjustable error correction capability setting of the encoding circuit 102/202/302 by the first error correction capability T1 (step 904). On the other hand, if the data type shows that the input data D1 is normal user data, the control circuit 104/204/304 sets the adjustable error correction capability setting of the encoding circuit 102/202/302 by the second error correction capability T2 (step 906). In this embodiment, as the control data or table is more significant than the normal user data, the first error correction capability T1 is preferably greater than the second error correction capability T2. Then, the encoding circuit 102/202/302 performs the data encoding operation according to the configured error correction capability setting and the finite field setting set by the afore-mentioned finite field configuring scheme (step 908).

With regard to the data decoding, the control circuit 104/204/304 checks the data type of the readout data D2 (step 902). If the data type shows that the readout data D2 is control data or table, the control circuit 104/204/304 sets the adjustable error correction capability setting of the decoding circuit 106/206/306 by the first error correction capability T1 (step 904). On the other hand, if the data type shows that the readout data D2 is normal user data, the control circuit 104/204/304 sets the adjustable error correction capability setting of the decoding circuit 106/206/306 by the second error correction capability T2 (step 906). Then, the decoding circuit 106/206/306 performs the data decoding operation according to the configured error correction capability setting (step 908).

In an alternative design, the control circuit 104/204/304 adjusts the adjustable error correction capability settings of the encoding circuit 102/202/302 and decoding circuit 106/206/306 according to an error rate of decoding the readout data D2.

Figure 10:
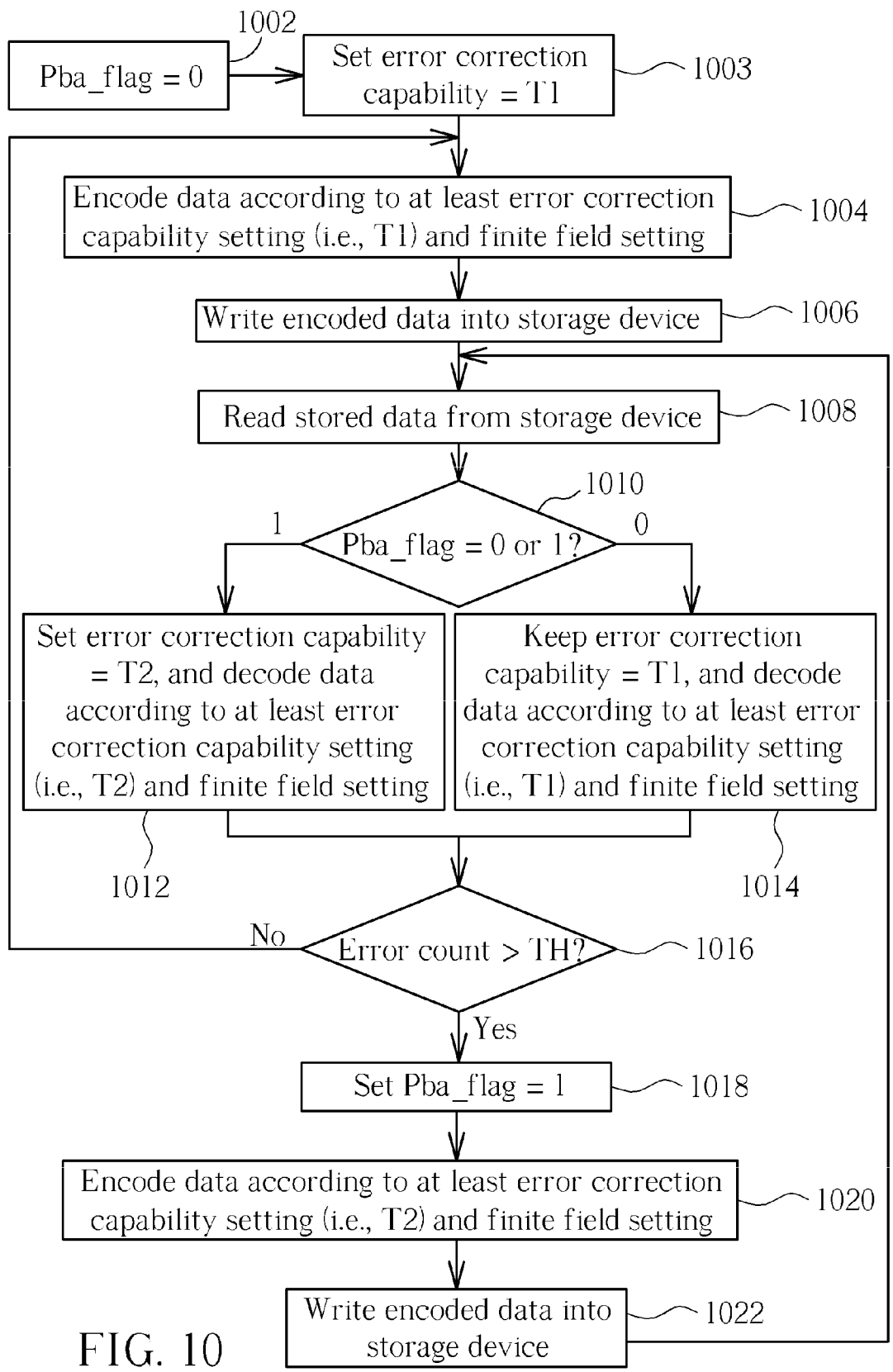
FIG. 10 is a flowchart illustrating an operation of the encoding circuit/decoding circuit whose error correction capability setting is configured by a decoding error rate.

FIG. 10 is a flowchart illustrating an operation of the encoding circuit/decoding circuit whose error correction capability setting is configured by a decoding error rate. The flag Pba_flag is used to indicate which error correction capability should be employed. In this exemplary embodiment, when the flag Pba_flag is not asserted (i.e., Pba_flag=0), the error correction capability T1 will be adopted; however, when the flag Pba_flag is asserted (i.e., Pba_flag=1), the other error correction capability T2 will be adopted. For example, the error correction capability T2 is greater than the error correction capability T1. In the beginning, the error correction capability T1 and a finite field set by the above-mentioned finite field configuring scheme are therefore employed by the encoding circuit 102/202/302 to perform data encoding operation as Pba_flag=0 (steps 1002, 1003, 1004, and 1006). Besides, the error correction capability T1 and a finite field set by the above-mentioned finite field configuring scheme are employed by the decoding circuit 106/206/306 to perform data decoding operation as Pba_flag=0 (steps 1008, 1010, and 1014).

When the control circuit 104/204/304 detects that an error count exceeds a predetermined threshold TH, meaning that the error rate is higher than an acceptable level, the flag Pba_flag is asserted (steps 1016 and 1018). Therefore, the other error correction capability T2, which is greater than the error correction capability T1, will be employed by the encoding circuit 102/202/302 during the data encoding operation and employed by the decoding circuit 106/206/306 during the data decoding operation as Pba_flag=1 (steps 1020, 1022, and 1012).

In another alternative design, the control circuit 104/204/304 adjusts adjustable error correction capability settings of the encoding circuit 102/202/302 and decoding circuit 106/206/306 according to a hardware specification of the storage device 101.

Figure 11:
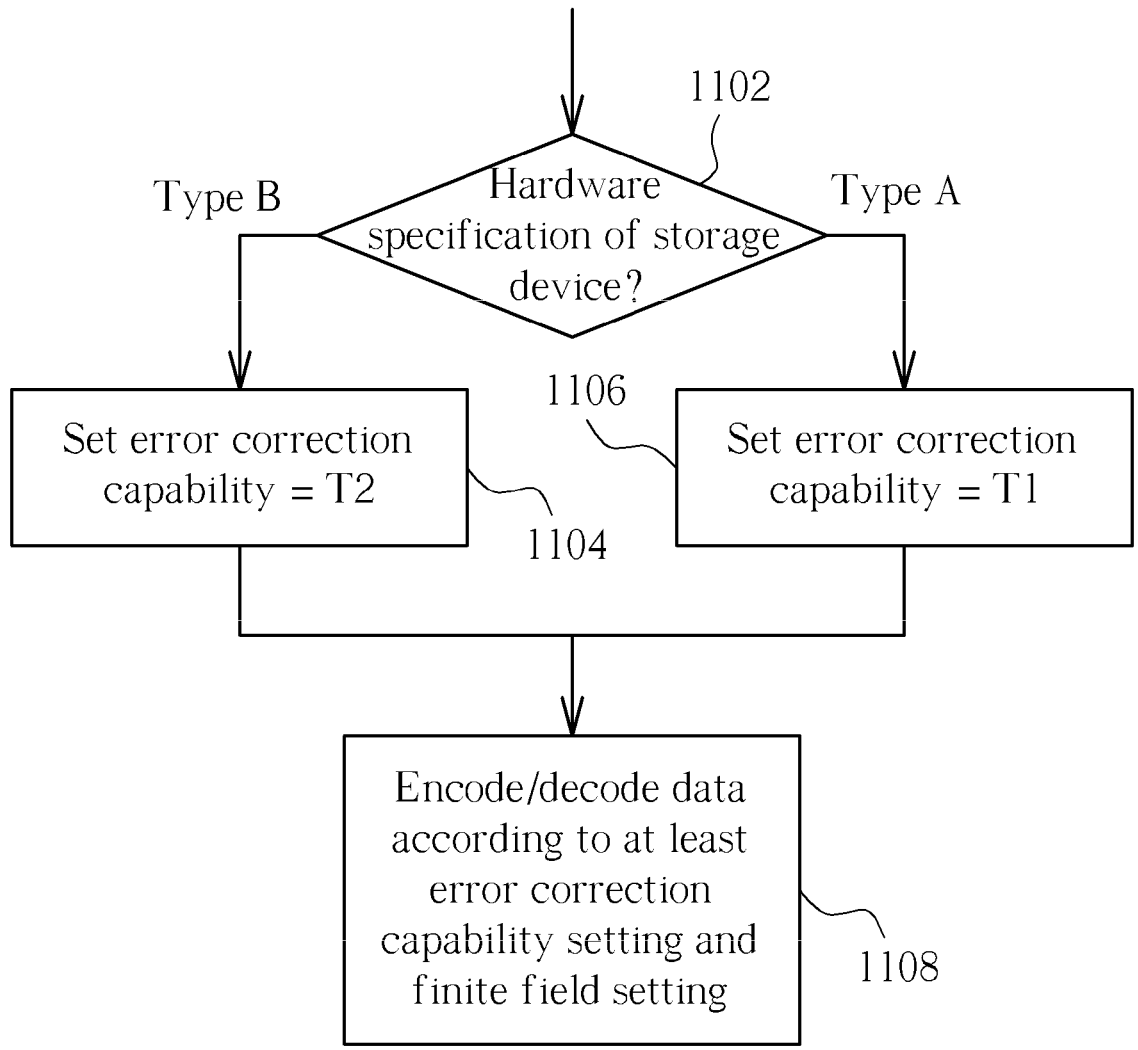
FIG. 11 is a flowchart illustrating an operation of the encoding circuit/decoding circuit whose error correction capability setting is configured by a hardware specification of a storage device.

FIG. 11 is a flowchart illustrating an operation of the encoding circuit/decoding circuit whose error correction capability setting is configured by a hardware specification of a storage device. In step 1102, the control circuit 104/204/304 checks the hardware specification of the storage device 101. For example, the error correction capability can be set based on the size of the spare area of the storage device 101, where the spare area is defined for storing parity data. Specifically, in a condition where it is found that the spare area of the storage device 101 is large enough, the error correction capability may be set higher than the nominal setting defined by the manufacturer of the storage device 101.

If the device type is type A, the control circuit 104/204/304 sets the adjustable error correction capability settings of the encoding circuit 102/202/302 and decoding circuit 106/206/306 by the first error correction capability T1 (step 1106). On the other hand, if the device type is type B, the control circuit 104/204/304 sets the adjustable error correction capability settings of the encoding circuit 102/202/302 and decoding circuit 106/206/306 by the second error correction capability T2 (step 1104). Then, the encoding circuit 102/202/302 performs the data encoding operation according to its configured error correction capability setting, and the decoding circuit 106/206/306 performs the data decoding operation according to its configured error correction capability setting (step 1108).

In another case where the encoding circuit 102/202/302 and the decoding circuit 106/206/306 are also programmable to support different codeword lengths, the control circuit 104/204/304 further controls an adjustable codeword length setting of the encoding circuit 102/202/302 and an adjustable codeword length setting of the decoding circuit 106/206/306. Therefore, the encoding circuit 102/202/302 generates the encoded data D1' by encoding the input data D1 according to the corresponding adjustable finite field setting and adjustable codeword length setting, and the decoding circuit 106/206/306 generates the decoded data D2' by decoding the readout data D2 according to the corresponding adjustable finite field setting and adjustable codeword length setting. For example, the control circuit 104/204/304 adjusts the adjustable codeword length setting according to a data format of the input data D1/readout data D2.

Figure 12:
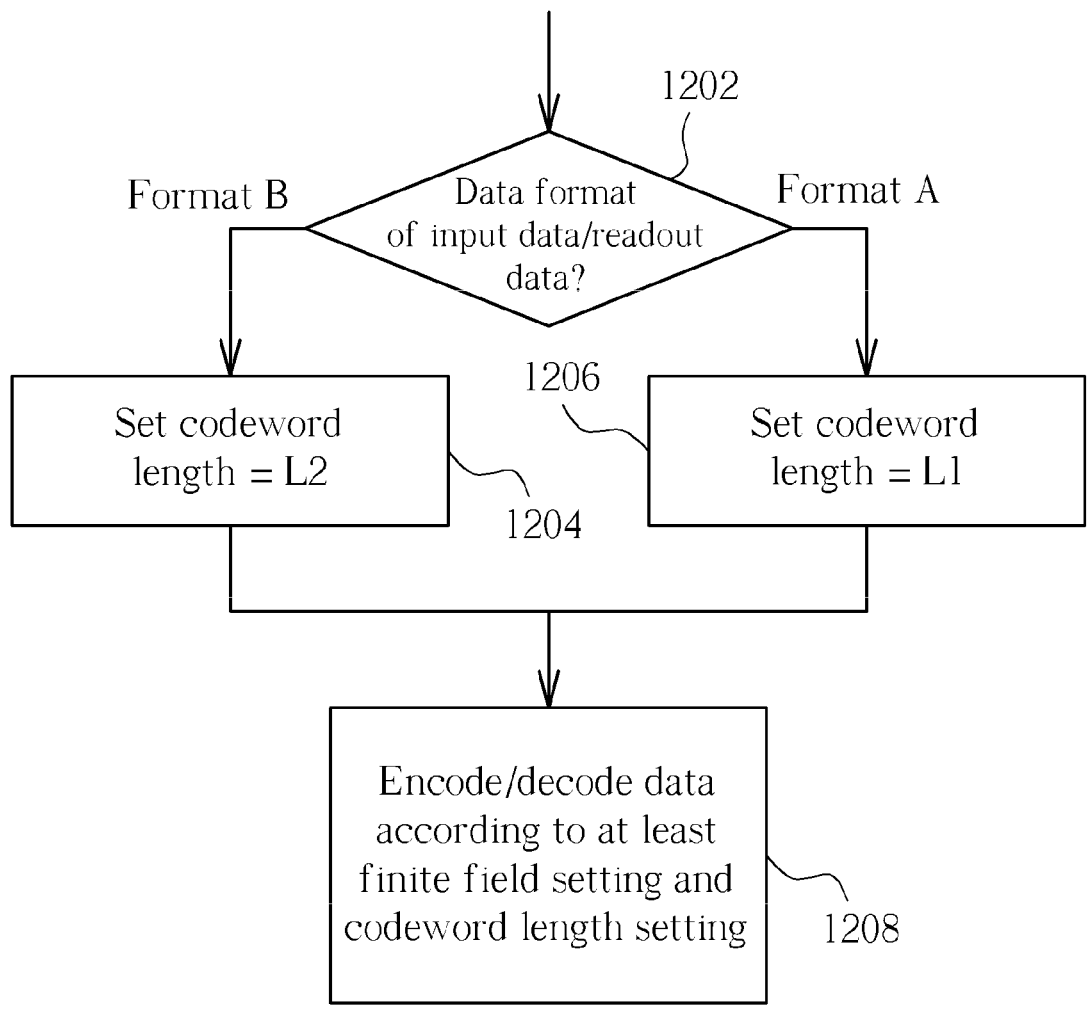
FIG. 12 is a flowchart illustrating an operation of the encoding circuit/decoding circuit whose codeword length setting is configured by a data format of input data.

FIG. 12 is a flowchart illustrating an operation of the encoding circuit/decoding circuit whose codeword length setting is configured by a data format of input data. In step 1202, the control circuit 104/204/304 checks the data format of the input data D1. For example, the data amount of the customized control or information data is generally small. Therefore, if the data format shows that the input data D1 is customized control or information data, the control circuit 104/204/304 can employ a shorter codeword length when encoding the customized control or information data, thereby increasing the data readout speed of reading the encoded control or information data from the storage device. Alternatively, the customized control/information data and other data segment may be encoded together by the control circuit 104/204/304 with a longer codeword length.

Therefore, if the data format of the input data D1 corresponds to format A, the control circuit 104/204/304 sets the adjustable codeword length setting of the encoding circuit 102/202/302 by the first codeword length L1 (step 1206). On the other hand, if the data format of the input data D1 corresponds to format B, the control circuit 104/204/304 sets the adjustable codeword length setting of the encoding circuit 102/202/302 by the second codeword length L2 (step 1204). Then, the encoding circuit 102/202/302 performs the data encoding operation according to the configured codeword length setting and a finite field set by the above-mentioned finite file configuring scheme (step 1208). With regard to data decoding, the control circuit 104/204/304 checks a data format of the readout data D2 (step 1202). If the data format of the readout data D2 corresponds format A, the control circuit 104/204/304 sets the adjustable codeword length setting of the decoding circuit 106/206/306 by the first codeword length L1 (step 1206). On the other hand, if the data format of the readout data D2 corresponds to format B, the control circuit 104/204/304 sets the adjustable codeword length setting of the decoding circuit 106/206/306 by the second codeword length T2 (step 1204). Then, the decoding circuit 106/206/306 performs the data decoding operation according to the configured codeword length setting and a finite field set by the above-mentioned finite field configuring scheme (step 1208).

In an alternative design, the control circuit 104/204/304 adjusts adjustable codeword length settings of the encoding circuit 102/202/302 and decoding circuit 106/206/306 according to a hardware specification of the storage device 101.

Figure 13:
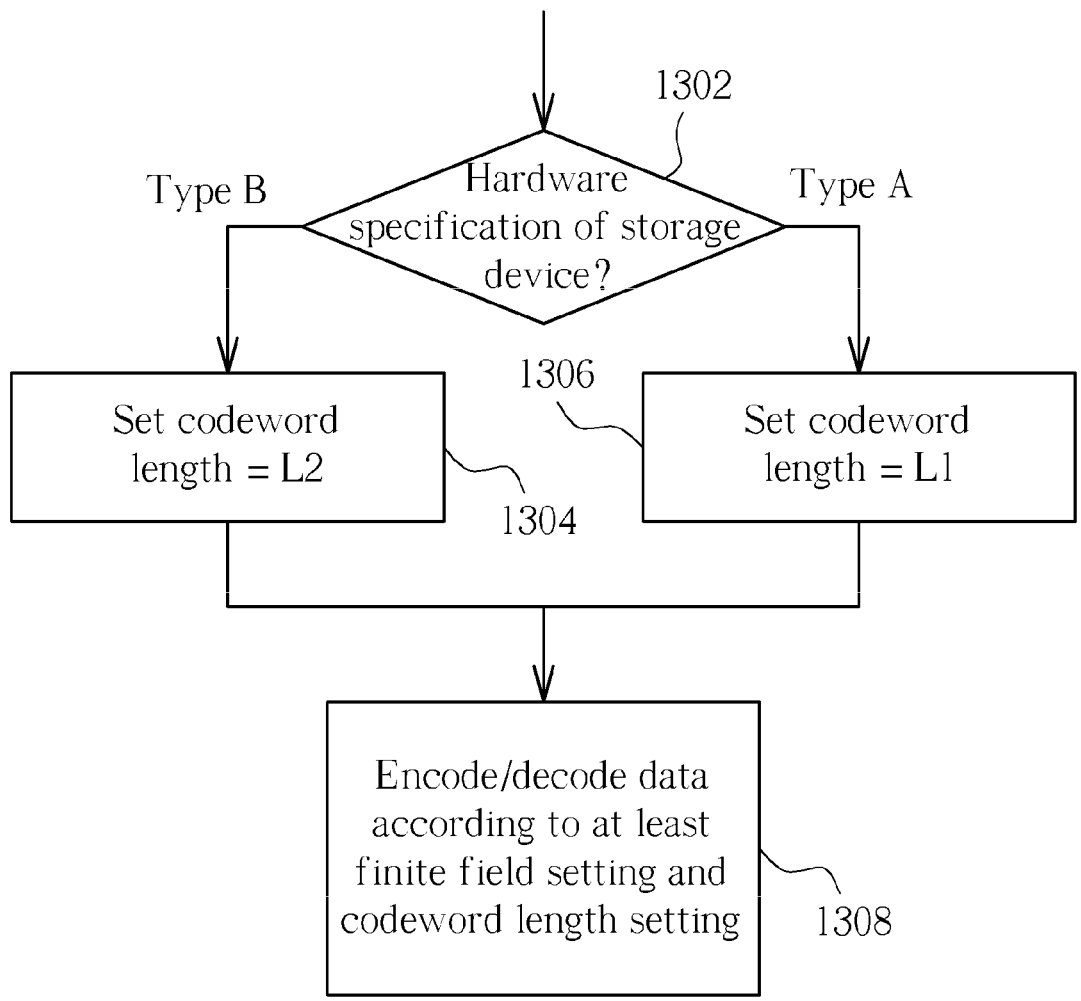
FIG. 13 is a flowchart illustrating an operation of the encoding circuit/decoding circuit whose codeword length setting is configured by a hardware specification of a storage device.

FIG. 13 is a flowchart illustrating an operation of the encoding circuit/decoding circuit whose codeword length setting is configured by a hardware specification of a storage device. In step 1302, the control circuit 104/204/304 checks the hardware specification of the storage device 101. For example, the codeword length can be set based on the size of the spare area of the storage device 101, where the spare area is defined for storing parity data. If the device type is type A, the control circuit 104/204/304 sets the adjustable codeword length settings of the encoding circuit 102/202/302 and decoding circuit 106/206/306 by the first codeword length L1 (step 1306). On the other hand, if the device type is type B, the control circuit 104/204/304 sets the adjustable codeword length settings of the encoding circuit 102/202/302 and decoding circuit 106/206/306 by the second codeword length L2 (step 1304). Then, the encoding circuit 102/202/302 performs the data encoding operation according to the configured codeword length setting and a finite field set by the above-mentioned finite field configuring scheme, and the decoding circuit 106/206/306 performs the data decoding operation according to the configured codeword length setting and a finite field set by the above-mentioned finite field configuring scheme (step 1308).

Figure 14:
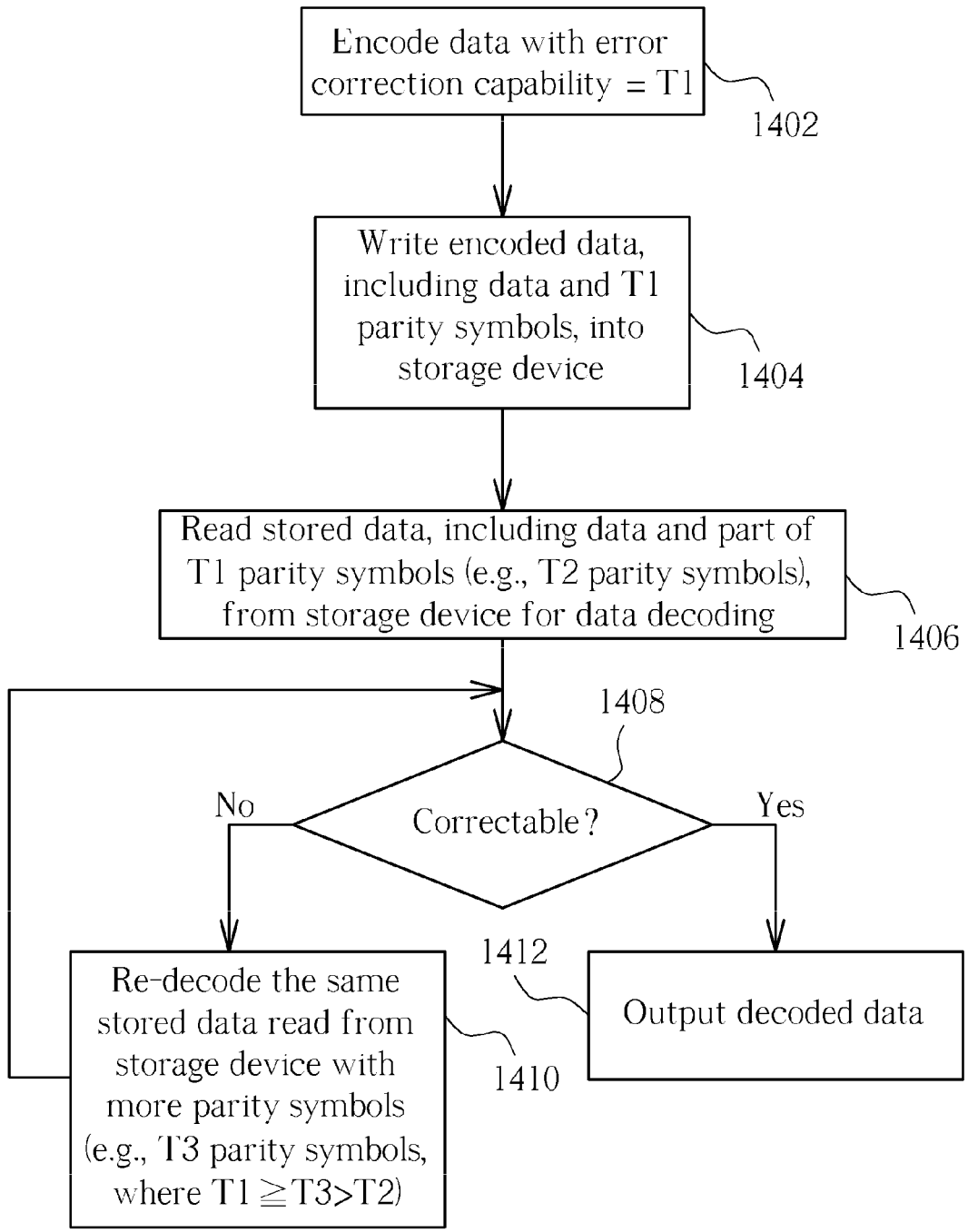
FIG. 14 is a flowchart illustrating an operation of a re-decoding function employed by the decoding circuit.

Regarding the decoding circuit 106/206/306, an additional re-decoding function may also be employed. FIG. 14 is a flowchart illustrating an operation of a re-decoding function employed by the decoding circuit 106/206/306. The encoding circuit 102/202/302 encodes data by using a greater error correction capability. By way of example, but not limitation, a first error correction capability T1 which is the greatest error correction capability supported by the encoding circuit 102/202/302 is used. The encoding circuit 102/202/302 therefore writes the encoded data, including data and T1 parity symbols, into the storage device 101 (steps 1402 and 1404). When the data decoding operation is actuated, the stored data is read from the storage device 101, and only part of the T1 parity symbols, such as T2 parity symbols (T2<T1), is used by the decoding circuit 106/206/306 to decode the readout data (step 1406).

That is, the control circuit 104/204/304 configures the decoding circuit 106/206/306 to decode the readout data by using a second error correction capability T2. It is possible that the T2 parity symbols are enough to correct the error bits when the number of error bits is small. As only part of the T1 parity symbols is actually used during the decoding operation, not all of the decoding hardware is enabled to accomplish the decoding operation. Thus, the overall power consumption can be effectively lowered. If the error bits found in the readout data can be successfully corrected through the T2 parity symbols, the error-free decoded data are outputted (steps 1408 and 1412). However, if a decoding error of decoding the readout data occurs, meaning that not all errors found in the readout data cannot be successfully corrected through the T2 parity symbols, the control circuit 104/204/304 will control the decoding circuit 106/206/306 to use more parity symbols selected from the T1 parity symbols (steps 1408 and 1410). For example, the control circuit 104/204/304 instructs the decoding circuit 106/206/306 to re-decode the same readout data by using a third error correction capability T3, where T1$\geq$T3>T2. The re-decoding operation will not stopped until no decoding error is detected. In other words, when the readout data can be successfully decoded using a specific error correction capability, a corresponding decoded data is outputted (steps 1408 and 1412). Please note that step 1408 may be configured to judge the correctability of the encoded data through checking if an error rate of decoding the encoded data exceeds a threshold value. This also obeys the spirit of the present invention.

The aforementioned storage device 101 may be a NAND flash-based device, such as a solid state drive (SSD). Taking the SSD for example, it is a closed-loop system, therefore the employed encoding and decoding formats thereof can be arbitrarily defined by the storage controller of the SSD as long as the minimum ECC requirement of the NAND flash is satisfied. To meet the high bandwidth requirement of the host, a multi-channel architecture is employed by the NAND flash of the SSD to use a plurality of physical channels for data transmission. Moreover, due to the multi-field characteristic of the SSD, only one filed is allowed to be adjusted, which is different from the nibble-based or byte-based device, such as an optical disc drive (ODD).

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A storage controller of controlling data access of a storage device, comprising:
   a decoding circuit, programmable to support a plurality of different error correction capabilities, for generating decoded data according to an adjustable error correction capability setting;
   a control circuit, coupled to the decoding circuit, for reading data from the storage device to obtain readout data and adjusting the adjustable error correction capability setting supported by the decoding circuit; and
   an encoding circuit, for generating encoded data according to a first error correction capability;
   wherein the control circuit further records the encoded data into the storage device, and sets the adjustable error correction capability setting by a second error correction capability; and
   when a decode error of decoding the readout data according to the second error correction capability occurs, the control circuit sets the adjustable error correction capability setting by a third error correction capability, and the decoding circuit re-decodes the readout data according to the third error correction capability, where the first error correction capability is equal to or greater than the third error correction capability, and the third error correction capability is greater than the second error correction capability.

2. A storage controller of controlling data access of a storage device, comprising:
   an encoding circuit, programmable to support a plurality of different finite fields, for generating encoded data according to an adjustable finite field setting; and
   a control circuit, coupled to the encoding circuit, for controlling the adjustable finite field setting of the encoding circuit and recording data into the storage device according to the encoded data;
   wherein the encoding circuit comprises a plurality of encoders corresponding to the different finite fields, respectively, and enables one of the encoders according to an enable signal; and the control circuit generates the enable signal to set the adjustable finite field setting of the encoding circuit.

3. The storage controller of claim 2, wherein the storage device is a non-volatile memory.

4. The storage controller of claim 2, wherein the storage device has a multi-channel architecture utilizing a plurality of physical channels for data transmission.

5. A storage controller of controlling data access of a storage device, comprising:
   a decoding circuit, programmable to support a plurality of different finite fields, for generating decoded data according to an adjustable finite field setting; and
   a control circuit, coupled to the decoding circuit, for reading data from the storage device to obtain readout data and controlling the adjustable finite field setting of the decoding circuit;
   wherein the decoding circuit comprises a plurality of decoders corresponding to the different finite fields, respectively, and enables one of the decoders according to an enable signal; and the control circuit generates the enable signal to set the adjustable finite field setting of the decoding circuit.

6. The storage controller of claim 5, wherein the storage device is a non-volatile memory.

7. The storage controller of claim 5, wherein the storage device has a multi-channel architecture utilizing a plurality of physical channels for data transmission.

8. A method of controlling data access of a storage device, comprising:
- controlling an adjustable finite field setting, wherein the adjustable finite field setting is programmable to support a plurality of different finite fields;
- controlling an adjustable error correction capability setting, wherein the adjustable error correction capability setting is programmable to support a plurality of different error correction capabilities;
- generating encoded data according to the adjustable finite field setting or the adjustable error correction capability setting; and
- recording data into the storage device according to the encoded data.

9. A method of controlling data access of a storage device, comprising:
- controlling an adjustable finite field setting, wherein the adjustable finite field setting is programmable to support a plurality of different finite fields;
- controlling an adjustable codeword length setting, wherein the adjustable codeword length setting is programmable to support a plurality of different codeword length settings;
- generating encoded data according to the adjustable finite field setting or the adjustable codeword length setting; and
- recording data into the storage device according to the encoded data.

10. A method of controlling data access of a storage device, comprising:
- reading data from the storage device to obtain readout data;
- controlling an adjustable finite field setting, wherein the adjustable finite field setting is programmable to support a plurality of different finite fields;
- controlling an adjustable error correction capability setting, wherein the adjustable error correction capability setting is programmable to support a plurality of different error correction capabilities; and
- generating decoded data by decoding the readout data according to the adjustable finite field setting or the adjustable error correction capability setting.

11. A method of controlling data access of a storage device, comprising:
- reading data from the storage device to obtain readout data;
- controlling an adjustable finite field setting, wherein the adjustable finite field setting is programmable to support a plurality of different finite fields;
- controlling an adjustable codeword length setting, wherein the adjustable codeword length setting is programmable to support a plurality of different codeword length settings; and
- generating decoded data by decoding the readout data according to the adjustable finite field setting or the adjustable codeword length setting.

* * * * *